(12) United States Patent
Lin et al.

(10) Patent No.: US 10,180,742 B2
(45) Date of Patent: Jan. 15, 2019

(54) DISPLAY PANEL, METHOD FOR FABRICATING THE SAME, AND DISPLAY APPARATUS

(71) Applicant: BOE TECHNOLOGY GROUP CO., LTD., Beijing (CN)

(72) Inventors: Chuni Lin, Beijing (CN); Minghsi Wang, Beijing (CN)

(73) Assignee: BOE Technology Group Co., LTD., Beijing (CN)

( * ) Notice: Subject to any disclaimer, the term of this patent is extended or adjusted under 35 U.S.C. 154(b) by 198 days.

(21) Appl. No.: 15/159,341

(22) Filed: May 19, 2016

(65) Prior Publication Data

US 2017/0038874 A1 Feb. 9, 2017

(30) Foreign Application Priority Data

Aug. 3, 2015 (CN) .......................... 2015 1 0468522

(51) Int. Cl.
*G06F 3/041* (2006.01)
*H01L 27/32* (2006.01)
(Continued)

(52) U.S. Cl.
CPC .......... *G06F 3/0412* (2013.01); *H01L 27/322* (2013.01); *H01L 27/323* (2013.01);
(Continued)

(58) Field of Classification Search
CPC . H01L 51/5253; H01L 27/322; H01L 27/323; G06F 3/0412
See application file for complete search history.

(56) References Cited

U.S. PATENT DOCUMENTS 9,693,391 B2 * 6/2017 Jang ...................... H05B 1/0294
9,846,324 B2 * 12/2017 Yang ................... G02F 1/13338
(Continued)

FOREIGN PATENT DOCUMENTS

CN   103000580 A   3/2013
CN   103258840 A   8/2013
(Continued)

OTHER PUBLICATIONS

First Office Action dated Jul. 5, 2017 corresponding to Chinese application No. 201510468522.9.
(Continued)

*Primary Examiner* — Abbas I Abdulselam
(74) *Attorney, Agent, or Firm* — Nath Goldberg and Meyer; Joshua B. Goldberg

(57) ABSTRACT

The present invention provides a display panel, a method for fabricating the same and a display apparatus. The display panel includes a first substrate; a pixel driving circuit and an organic light-emitting diode device sequentially provided on the first substrate; a protection layer provided at a light-outgoing side of the display panel; and a touch sensing line provided at a side of the protection layer away from the organic light-emitting diode device, the touch sensing line being able to achieve touch-control of the display panel. By providing the protection layer at the light-outgoing side of the display panel and providing the touch sensing line at the side of the protection layer away from the organic light-emitting diode device, the display panel can achieve both touch-control and display without being provided with a touch panel at the light-outgoing side thereof, thereby significantly reducing the overall thickness of the display panel.

10 Claims, 2 Drawing Sheets

(51) Int. Cl.
*H01L 51/52* (2006.01)
*H01L 51/56* (2006.01)
(52) U.S. Cl.
CPC ...... *H01L 27/3276* (2013.01); *H01L 51/5253* (2013.01); *H01L 51/56* (2013.01); *G06F 2203/04103* (2013.01); *H01L 2227/323* (2013.01); *H01L 2251/558* (2013.01)

(56) References Cited

U.S. PATENT DOCUMENTS

| | | | | |
|---|---|---|---|---|
| 2003/0234769 | A1* | 12/2003 | Cross | G06F 3/0412 345/173 |
| 2009/0167718 | A1* | 7/2009 | Lee | G06F 3/0416 345/174 |
| 2010/0253485 | A1* | 10/2010 | Park | G06F 1/1626 340/407.2 |
| 2011/0050604 | A1 | 3/2011 | Kwon et al. | |
| 2013/0027325 | A1* | 1/2013 | Liu | G06F 3/0412 345/173 |

FOREIGN PATENT DOCUMENTS

| | | |
|---|---|---|
| CN | 104393025 A | 3/2015 |
| KR | 1020110020049 A | 3/2011 |
| KR | 1020110044670 A | 4/2011 |
| KR | 20150070663 A | 6/2015 |

OTHER PUBLICATIONS

Chinese office action dated Jan. 3, 2018 for corresponding CN application No. 201510468522.9 with English translation attached.

* cited by examiner

DISPLAY PANEL, METHOD FOR FABRICATING THE SAME, AND DISPLAY APPARATUS

CROSS-REFERENCE TO RELATED APPLICATION

This application claims priority to Chinese Patent Application No. 201510468522.9, filed on Aug. 3, 2015, the contents of which are incorporated by reference in the entirety.

FIELD OF THE INVENTION

The present invention relates to the field of display technology, and particularly relates to a display panel, a method for fabricating the same, and a display apparatus.

BACKGROUND OF THE INVENTION

OLED (organic light-emitting diode) display apparatuses have advantages such as ultra-thinness, low cost, low power consumption, wide viewing angle, all-solid, self-illumination, and low driving voltage, etc., and have thus become a promising new generation of flat-panel display apparatuses. At present, a touch panel is generally provided on an OLED display panel to achieve touch-control of the OLED display panel. In a conventional OLED touch display panel, touch-control of an OLED display panel is achieved by attaching a touch panel provided with a touch sensing circuit to a display surface of the OLED display panel.

However, the overall thickness of the OLED touch display panel will be increased by attaching the touch panel provided with the touch sensing circuit to the OLED display panel, which goes against development towards lighter weight and smaller thickness of OLED touch display panels.

SUMMARY OF THE INVENTION

An object of the present invention is to provide a display panel, a method for fabricating the same and a display apparatus including the display panel. The display panel can realize both touch-control and display without being provided with a touch panel at a light-outgoing side thereof, and thus have a small overall thickness.

According to one aspect of the present invention, there is provided a display panel, which includes a first substrate; a pixel driving circuit and an organic light-emitting diode device sequentially provided on the first substrate; a protection layer provided at a light-outgoing side of the display panel; and a touch sensing line provided at a side of the protection layer away from the organic light-emitting diode device, the touch sensing line being able to achieve touch-control of the display panel.

Optionally, the touch sensing line is distributed on a surface of the protection layer.

Optionally, the touch sensing line is embedded in the protection layer, an upper surface of the touch sensing line away from the organic light-emitting diode device is flush with an upper surface of the protection layer away from the organic light-emitting diode device, and a thickness of the touch sensing line is smaller than that of the protection layer.

Optionally, the thickness of the protection layer ranges from 1.5 μm to 4 μm.

Optionally, the protection layer is made of a transparent photosensitive organic material, or a mixture of a transparent photosensitive organic material and a transparent photosensitive inorganic material.

Optionally, the display panel further includes a color filter layer provided at the side of the protection layer away from the organic light-emitting diode device and distributed on a surface of the protection layer.

Optionally, the display panel further includes a color filter layer provided at the side of the protection layer away from the organic light-emitting diode device and embedded in the protection layer, an upper surface of the color filter layer away from the organic light-emitting diode device is flush with an upper surface of the protection layer away from the organic light-emitting diode device, and a thickness of the color filter layer is smaller than that of the protection layer.

Optionally, the color filter layer is arranged in a display area of the display panel; the touch sensing line is made of a metal material and is arranged in a non-display area of the display panel.

Optionally, the color filter layer is arranged in a display area of the display panel; the touch sensing line is made of a transparent conductive material and is also arranged in the display area of the display panel.

Optionally, a package layer for packaging the touch sensing line and the color filter layer is provided at a side of the touch sensing line and the color filter layer away from the protection layer.

Optionally, the light-outgoing side of the display panel is a side of the organic light-emitting diode device away from the first substrate.

Optionally, the light-outgoing side of the display panel is a side of the first substrate away from the organic light-emitting diode device.

According to another aspect of the present invention, there is provided a display apparatus, which includes the above display panel.

According to still another aspect of the present invention, there is provided a method for fabricating a display panel, including steps of:

sequentially forming a pixel driving circuit and an organic light-emitting diode device on a first substrate;

forming a protection layer at a light-outgoing side of the display panel; and forming a touch sensing line at a side of the protection layer away from the organic light-emitting diode device.

The beneficial effects of the present invention are as follows: in the display panel provided by the present invention, by providing the protection layer at the light-outgoing side of the display panel and providing the touch sensing line at the side of the protection layer away from the organic light-emitting diode device, the display panel can achieve both touch-control and display without being provided with a touch panel at the light-outgoing side thereof, thereby significantly reducing the overall thickness of the display panel; meanwhile, with the protection layer, the organic light-emitting diode device will not be affected when forming the touch sensing line using a conventional patterning process, thereby improving the yield of the display panels.

By using the above display panel, the display apparatus provided by the present invention can not only achieve both touch-control and display, but can also have a significantly reduced overall thickness.

DESCRIPTION OF THE PREFERRED EMBODIMENT

In order that those skilled in the art better understand the technical solutions of the present invention, a display panel, a method for fabricating the same and a display apparatus provided by the present invention will be further described in detail below in conjunction with the accompanying drawings and specific implementations.

Figure 1:
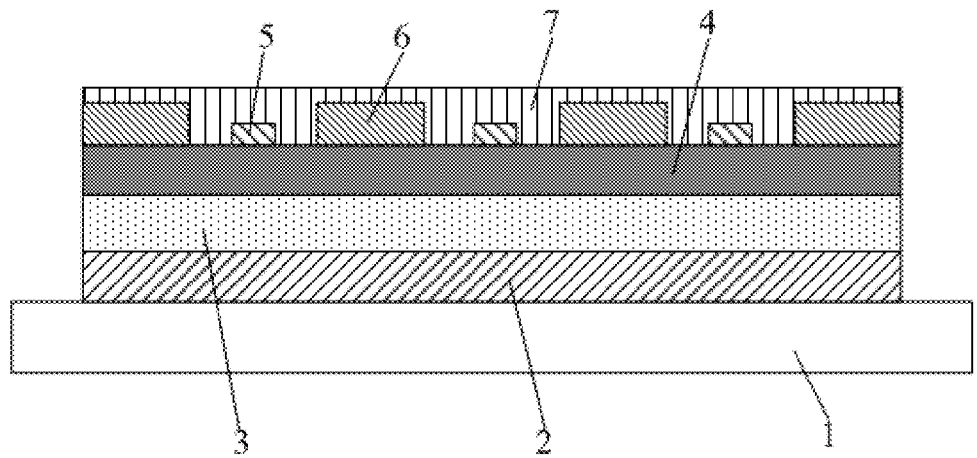
FIG. 1 is a cross-sectional diagram of a structure of a display panel provided by an embodiment of the present invention.

Embodiments of the present invention provide a display panel, as shown in FIG. 1, the display panel includes: a first substrate 1; a pixel driving circuit 2 and an organic light-emitting diode device 3 sequentially formed on the first substrate 1; a protection layer 4 provided at a light out-going side of the display panel; and touch sensing lines 5 provided at a side of the protection layer 4 away from the organic light-emitting diode device 3, the touch sensing lines 5 being able to achieve touch-control of the display panel. Here, the pixel driving circuit 2 is a thin film transistor control circuit (i.e., TFT control circuit).

By providing the protection layer 4 at the light-outgoing side of the display panel and providing the touch sensing lines 5 at the side of the protection layer 4 away from the organic light-emitting diode device 3, the display panel can achieve both touch-control and display without being provided with a touch panel at the light-outgoing side thereof, thereby significantly reducing the overall thickness of the display panel; meanwhile, with the protection layer 4, the organic light-emitting diode device 3 will not be affected when forming the touch sensing lines 5 using a conventional patterning process, thereby improving the yield of the display panels.

In some embodiments, the touch sensing lines 5 are distributed on a surface of the protection layer 4. The protection layer 4 may have a thickness in the range of 1.5 µm to 4 µm. The protection layer 4 having such a thickness can protect the organic light-emitting diode device 3 well when forming the touch sensing lines 5 using a patterning process, and prevent the organic light-emitting diode device 3 from being impacted by an exposing process. In addition, the protection layer 4 is made of a transparent photosensitive organic material, or a mixture of a transparent photosensitive organic material and a transparent photosensitive inorganic material. The protection layer 4 made of the foregoing material will not affect normal light emission of the display panel, and can be formed easily since the protection layer 4 can be formed simply by coating a film layer of the foregoing material and then performing exposure and development.

In some embodiments, the display panel further includes color filter layers 6, which are provided at a side of the protection layer 4 away from the organic light-emitting diode device 3 and are also distributed on the surface of the protection layer 4. By providing the color filter layers 6 on the protection layer 4, the display panel does not need to be provided with a color filter substrate, which further reduces the overall thickness of the display panel.

Figure 2:
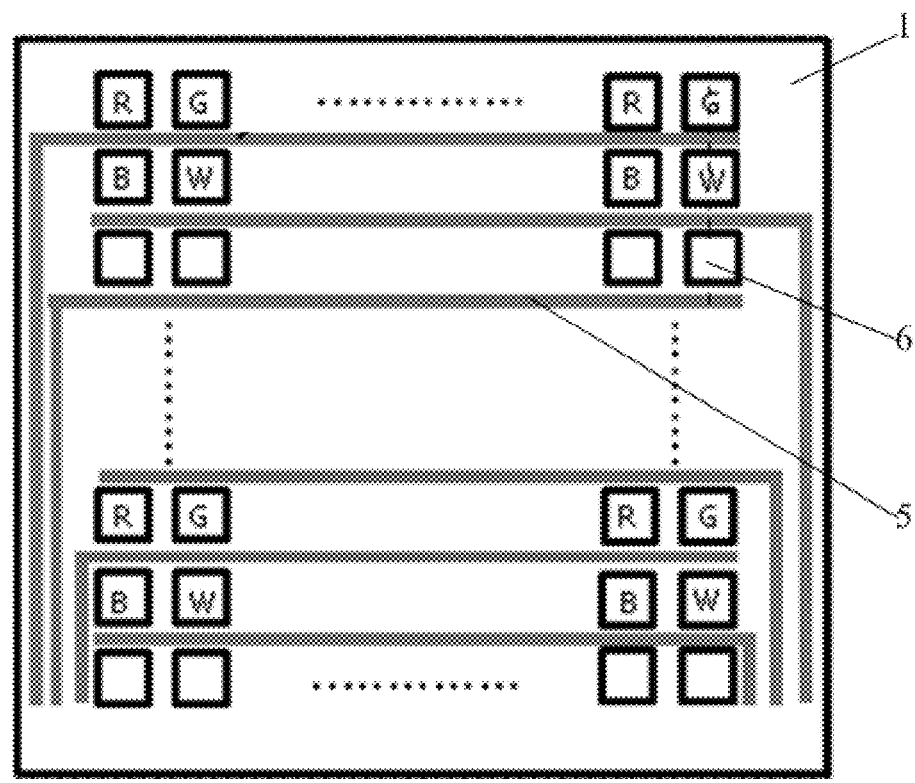
FIG. 2 is a schematic top view of distribution of touch sensing lines and color filter layers in FIG. 1.

The touch sensing lines 5 may be made of a metal material, in this case, the touch sensing lines 5 are positioned in non-display areas of the display panel, and the color filter layers 6 are positioned in display areas of the display panel, as shown in FIG. 2. With such configuration, the touch sensing lines 5 will not block outgoing light of the display panel, so that the aperture ratio of the display panel during display will not be impacted.

It should be noted that the touch sensing lines 5 may be made of a transparent conductive material such as Indium Tin Oxide, and in this case, since the touch sensing lines 5 will not block outgoing light of the display panel, the touch sensing lines 5 may also be provided in the display areas of the display panel. The touch sensing lines 5 and the color filter layers 6 both provided in the display areas may or may not overlap each other.

In some embodiments, a package layer 7, which is used for packaging the touch sensing lines 5 and the color filter layers 6, may be provided at a side of the touch sensing lines 5 and the color filter layers 6 away from the protection layer 4. With the package layer 7, the touch sensing lines 5 and the color filter layers 6 can not only be protected but also be prevented from being directly contacted by a hand when the hand touches the display panel, thereby ensuring normal touch-control and safety of touch.

In some embodiments, the light-outgoing side of the display panel is a side of the organic light-emitting diode device 3 away from the first substrate 1, that is, the display panel is a top-emission type OLED display panel, as shown in FIG. 1.

Figure 3:
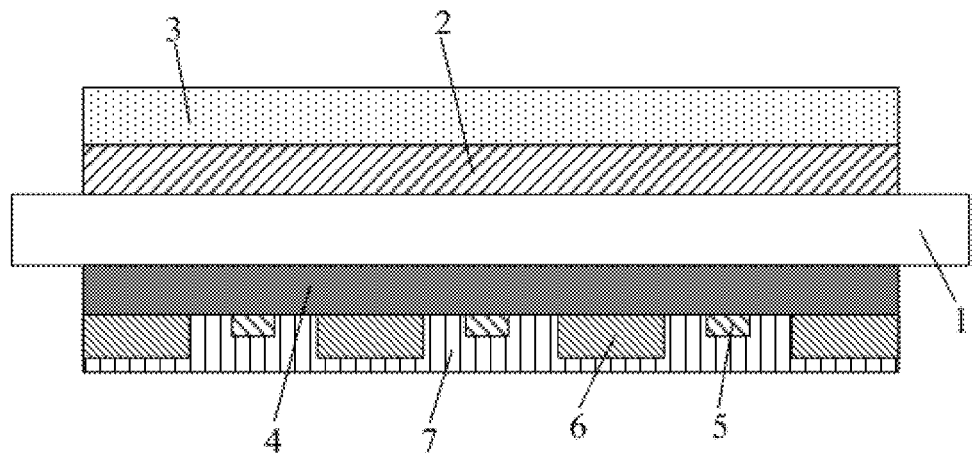
FIG. 3 is a cross-sectional diagram of a structure of a bottom-emission type display panel provided by an embodiment of the present invention.
Figure 4:
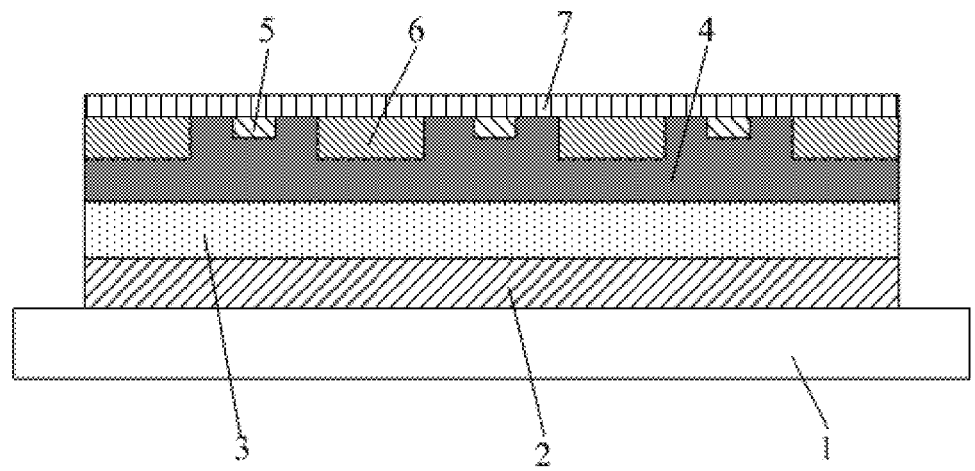
FIG. 4 is a cross-sectional diagram of a structure of another display panel provided by an embodiment of the present invention.

It should be noted that, the light-outgoing side of the display panel may be a side of the first substrate 1 away from the organic light-emitting diode device 3, that is, the display panel may be a bottom-emission type OLED display panel, as shown in FIG. 3.

Based on the above structure of the display panel, embodiments of the present invention further provide a method for fabricating the display panel, including steps of:

sequentially forming a pixel driving circuit 2 and an organic light-emitting diode device 3 on a first substrate 1;

forming a protection layer 4 at a light-outgoing side of the display panel; and forming touch sensing lines 5 at a side of the protection layer 4 away from the organic light-emitting diode device 3.

Here, the pixel driving circuit 2 and the organic light-emitting diode device 3 may be formed by using existing fabricating processes, which are not elaborated herein. The protection layer 4 may be formed by processes of coating of a film layer, exposure, development, and the like. The touch sensing lines 5 may be formed by using an existing patterning process, which is not elaborated herein. In addition, the display panel may include other functional layers such as a color filter layer 6, a package layer 7, etc., and these functional layers may be formed by using existing fabricating processes, which are not elaborated herein.

In some embodiments, the touch sensing lines 5 may be embedded in the protection layer 4, upper surfaces of the touch sensing lines 5 away from the organic light-emitting diode device 3 are flush with an upper surface of the protection layer 4 away from the organic light-emitting diode device 3, and a thickness of the touch sensing lines 5 is smaller than that of the protection layer 4. In this case, the total thickness of the touch sensing lines 5 and the protection layer 4 can be further reduced, so that the overall thickness of the display panel can be further reduced, and possible metal migration between the touch sensing lines 5 can be prevented. In the meanwhile, since the thickness of the touch sensing lines 5 is smaller than that of the protection layer 4, the protection layer 4 of a certain thickness remains between the touch sensing lines 5 and the organic light-emitting diode device 3 to separate them from each other. Therefore, it can be ensured that the organic light-emitting diode device 3 will not be impacted when forming the touch sensing lines 5 using a conventional patterning process, thereby ensuring the yield of the display panels.

In some embodiments, the color filter layers 6 may be embedded in the protection layer 4, and upper surfaces of the color filter layers 6 away from the organic light-emitting diode device 3 are flush with an upper surface of the protection layer 4 away from the organic light-emitting diode device 3, and a thickness of the color filter layers 6 is smaller than that of the protection layer 4. In this case, the display panel does not need to be provided with a color filter substrate, which further reduces the overall thickness of the display panel, and moreover, the total thickness of the color filter layers 6 and the protection layer 4 can be reduced, so that the overall thickness of the display panel is further reduced.

In some embodiments, the color filter layers 6 correspond to display areas of the display panel, and the touch sensing lines 5 are positioned in non-display areas of the display panel. Needless to say, both the color filter layers 6 and the touch sensing lines 5 may be positioned in the display areas of the display panel without overlapping each other, which helps to reduce the thickness of the entire display panel.

The embodiments of the present invention further provide a method for fabricating the above display panel, wherein the protection layer 4 formed at the light-outgoing side of the display panel includes grooves for accommodating the touch sensing lines 5.

Accordingly, the step of forming touch sensing lines 5 at a side of the protection layer 4 away from the organic light-emitting diode device 3 includes: forming the touch sensing lines 5 in the grooves of the protection layer 4.

To form the protection layer 4 having the grooves, patterns of the grooves for accommodating the touch sensing lines 5 may be formed in the protection layer 4 by means of incomplete exposure and development while forming a pattern of the protection layer 4 by means of exposure and development. The touch sensing lines 5 may be formed in the following way: a film layer of the touch sensing lines 5 is deposited on the protection layer 4 and then exposed, developed and etched.

In the display panel provided by the embodiments of the present invention, by providing the protection layer at the light-outgoing side of the display panel and providing the touch sensing line at the side of the protection layer away from the organic light-emitting diode device, the display panel can achieve both touch-control and display without being provided with a touch panel at the light-outgoing side thereof, thereby significantly reducing the overall thickness of the display panel; meanwhile, with the protection layer, the organic light-emitting diode device will not be affected when forming the touch sensing lines using a conventional patterning process, thereby improving the yield of the display panels.

Embodiments of the present invention further provide a display apparatus, which includes any one of the above display panels.

By using the above display panel, the display panel can achieve both touch-control and display, and the overall thickness of the display panel is greatly reduced.

The display apparatus may be any product or component having a display function, such as an OLED mobile phone, an OLED tablet computer, an OLED TV set, an OLED display, an OLED notebook computer, an OLED digital photo frame, an OLED navigator, etc.

It can be understood that the above implementations are merely exemplary implementations used for illustrating the principle of the present invention, but the present invention is not limited thereto. Those of ordinary skill in the art can make various modifications and improvements without departing from the spirit and essence of the present invention, and these modifications and improvements are also considered to be within the protection scope of the present invention.

The invention claimed is:

1. A display panel, comprising:
   a first substrate;
   a pixel driving circuit on the first substrate;
   an organic light-emitting diode device on a surface of the pixel driving circuit away from the first substrate;
   a protection layer provided at a light-outgoing side of the display panel:
   a touch sensing line at a side of the protection layer away from the organic light-emitting diode device, the touch sensing line being able to achieve touch-control of the display panel; and
   a color filter layer at the side of the protection layer away from the organic light-emitting diode device
   wherein an upper surface of the touch sensing line away from the protection layer is flush with an upper surface of the color filter layer away from the protection layer; or a lower surface of the touch sensing line proximal to the protection layer is flush with a lower surface of the color filter layer proximal to the protection layer.

2. The display panel according to claim 1, wherein the color filter layer and the touch sensing line are directly on a surface of the protection layer.

3. The display panel according to claim 1, wherein the color filter layer and the touch sensing line are embedded in the protection layer.

4. The display panel according to claim 3, wherein the upper surfaces of both the color filter layer and the touch sensing line away From the organic light-emitting diode device are flush with an upper surface of the protection layer away from the organic light-emitting diode device.

5. The display panel according to claim 1, wherein the color filter layer is arranged in a display area of the display panel; the touch sensing line is made of a metal material and is arranged in a non-display area of the display panel.

6. The display panel according to claim 1, wherein, a package layer for packaging the touch sensing line and the color filter layer is at a side or the touch sensing line and the color filter layer away From the protection layer.

7. The display panel according to claim 1, wherein the light-outgoing side of the display panel is a side of the first substrate away from the organic light-emitting diode device.

8. A method for fabricating a display panel, the display panel being the display panel according to claim 1, and the method comprising steps of:
   sequentially forming a pixel driving circuit and an organic light-emitting diode device on a first substrate;
   forming a protection layer at a light-outgoing side of the display panel;
   forming a touch sensing line at a side of the protection layer away from the organic light-emitting diode device; and
   forming a color filter layer at the side of the protection layer away from the organic light-emitting diode device,
   wherein the touch sensing line and the color filter layer are formed such that an upper surface of the touch sensing line away from the protection layer is flush with an upper surface of the color filter layer away from the protection layer: or a lower surface of the touch sensing line proximal to the protection layer is flush with a lower surface of the color filter layer proximal to the protection layer.

9. The display panel according to claim 1, wherein thicknesses of both the touch sensing line and the color filter layer are smaller than a thickness of the protection layer, and the thickness of the protection layer ranges from 1.5 μm to 44 μm.

10. A display apparatus, comprising the display panel according to claim 1.

* * * * *